(12) United States Patent
Chen et al.

(10) Patent No.: US 6,207,498 B1
(45) Date of Patent: Mar. 27, 2001

(54) METHOD OF FABRICATING A CORONARY-TYPE CAPACITOR IN AN INTEGRATED CIRCUIT

(75) Inventors: Weng-Yi Chen, Chupei; Kuen-Chu Chen, Hsinchu Hsien, both of (TW)

(73) Assignee: United Integrated Circuits Corp., Hsinchu (TW)

( * ) Notice: Subject to any disclaimer, the term of this patent is extended or adjusted under 35 U.S.C. 154(b) by 0 days.

(21) Appl. No.: 09/567,341

(22) Filed: May 9, 2000

Related U.S. Application Data (63) Continuation-in-part of application No. 09/128,349, filed on Aug. 3, 1998.

(30) Foreign Application Priority Data

Jun. 5, 1998 (TW) ................................................ 87108921

(51) Int. Cl.[7] ........................ H01L 21/8242; H01L 21/20
(52) U.S. Cl. ........................ 438/254; 438/253; 438/256; 438/398
(58) Field of Search .................................. 438/398, 253, 438/254, 255, 256, 257, 964

(56) References Cited

U.S. PATENT DOCUMENTS

| | | | | |
|---|---|---|---|---|
| 5,478,769 | * | 12/1995 | Lim ...................................... | 438/253 |
| 5,532,182 | | 7/1996 | Woo ...................................... | 437/52 |
| 5,677,222 | * | 10/1997 | Tseng .................................... | 438/253 |
| 5,770,499 | * | 6/1998 | Kwok et al. .......................... | 438/253 |
| 5,843,822 | * | 12/1998 | Hsia et al. ............................ | 438/254 |
| 5,851,876 | * | 12/1998 | Jenq ..................................... | 438/253 |
| 5,879,987 | * | 3/1999 | Wang .................................... | 438/253 |
| 5,907,774 | * | 5/1999 | Wise ..................................... | 438/254 |
| 5,929,492 | | 7/1999 | Okamura .............................. | 257/365 |
| 5,981,337 | | 11/1999 | Chuang ................................. | 438/253 |

* cited by examiner

Primary Examiner—Trung Dang
Assistant Examiner—Brook Kebede
(74) Attorney, Agent, or Firm—Thomas, Kayden, Horstemeyer & Risley (57) ABSTRACT

A method of fabricating a coronary-type capacitor in integrated circuit is provided, which method helps increase the capacitance of the capacitor by forming the electrode of the capacitor with a coronary-like shape that is relatively large in surface area. In this method, a stacked structure of doped polysilicon layers and HSG polysilcon layers are formed in an alternating manner, which is then selectively removed to form a void portion. A heat-treatment process is then performed on the wafer at a temperature of about 600–700° C. to cause the impurity ions in the doped polysilicon layers to be activated and evenly diffused over the inside of the doped polysilicon layers. Finally, a selective etching process is performed with an etchant that can react with polysilicon at a faster etching rate than with HSG polysilcon so as to cause the sidewalls of the doped polysilicon layers to be more recessed than the sidewalls of the HSG polysilcon layers. The remaining portions of the doped polysilicon layers and the HSG polysilcon layers in combination constitute a coronary-shaped electrode structure that serves as the bottom electrode of the capacitor.

21 Claims, 6 Drawing Sheets

METHOD OF FABRICATING A CORONARY-TYPE CAPACITOR IN AN INTEGRATED CIRCUIT

CROSS-REFERENCE TO RELATED APPLICATION

This application is a continuation in part of U.S. patent application Ser. No. 09/128,349, filed Aug. 3, 1998 (the full disclosure of which is incorporated herein by reference), which claimed the priority benefit of Taiwan application serial no. 87108921, filed Jun. 5, 1998.

BACKGROUND OF THE INVENTION

1. Field of the Invention

This invention relates to semiconductor fabrication technologies, and more particularly, to a method of fabricating a coronary-type capacitor to serve as a data storage element in a semiconductor memory device, such as a DRAM (dynamic random-access memory) device.

2. Description of Related Art:

A single memory cell of a DRAM device typically includes a transfer field effect transistor (TFET) and a data storage capacitor. Whether a DRAM cell stores a binary value of 1 or 0 is dependent on whether the capacitor element therein is fully charged or discharged. Fundamentally, the charge retaining capability of the capacitor is proportional to its capacitance, and the capacitance is proportional to the surface area of the electrodes of the capacitor.

Figure 1:
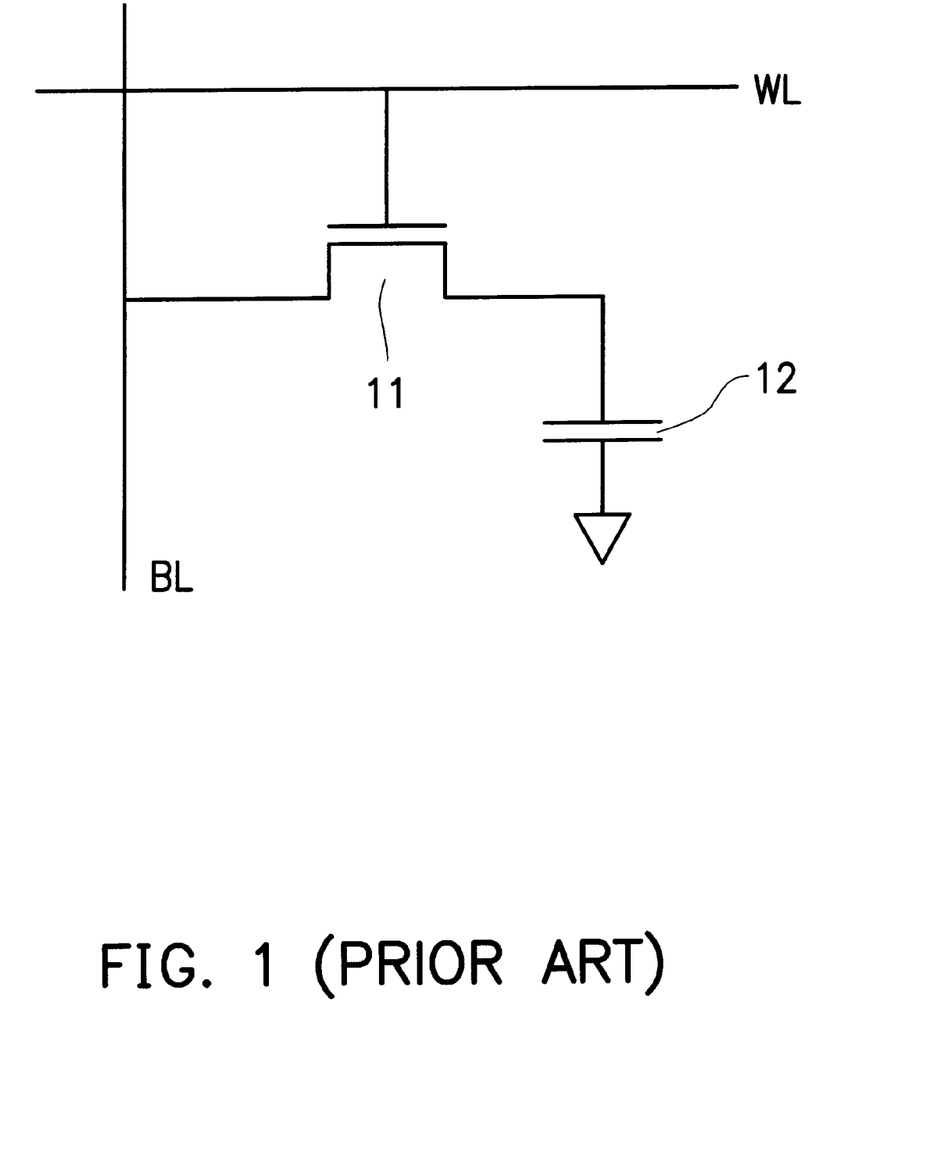
FIG. 1 is a schematic diagram showing the equivalent circuit of one memory cell of a DRAM device.

FIG. 1 is a schematic diagram showing the equivalent circuit structure of one memory cell of a typical DRAM device, which includes a MOS (metal-oxide semiconductor) transistor 11 serving as the TFET and a data storage capacitor 12. The MOS transistor 11 is formed in such a manner that its gate is connected to a word line WL, its source is connected to a bit line BL, and its drain is connected via the capacitor 12 to the ground. Whether the memory cell stores a binary data bit 0 or 1 is dependent on whether the capacitor 12 is fully charged or discharged. For example, the capacitor 12 retains a high voltage when fully charged. This high voltage represents storage of a first binary value, for example, 1, in the capacitor 12. In contrast, the capacitor 12 retains a null voltage when fully discharged. This null voltage represents storage of a second binary value, for example, 0, in the capacitor. Moreover, access to the capacitor 12, whether read or write, is controlled by the MOS transistor 11 whose ON/OFF state is controlled by the voltage state on the wordline WL.

In the fabrication of DRAMs with less than 1 MB (megabit) in capacity, it is a customary practice to utilize a two-dimensional capacitor called a planar-type capacitor as the data storage capacitor for each memory cell. Since the planar-type capacitor takes up quite a large layout area on the substrate, it is poorly suited for use in very large integration DRAMs. For 4 MB or higher DRAMs, a three-dimensional capacitor, such as a stacked-type or a trench-type capacitor, is utilized instead.

Compared to the planar-type capacitor, both the stacked-type capacitor and the trench-type capacitor can provide a relatively larger capacitance that allows the DRAM device to be further downsized while still allowing a good charge (data) retaining capability. However, when it comes to DRAMs of 64 MB or higher, both the stacked-type capacitor and the trench-type capacitor become inadequate.

One solution to the foregoing problem is to utilize the so-called fin-type capacitor. This type of capacitor has a very large capacitance due to the formation of a stacked structure with a plurality of horizontally extended conductive layers that are shaped like a fin to serve as the electrode of the capacitor.

Another solution is to utilize the so-called cylindrical-type capacitor. This type of capacitor also has a very large capacitance due to the formation of a vertically extended, cylindrically shaped electrode structure. This structure helps increase the surface area of the electrode, and thereby increase the capacitance of the capacitor.

A conventional method for fabricating a stacked-type capacitor for a DRAM device is illustratively depicted in the following with reference to FIGS. 2A–2D.

Figure 2A:
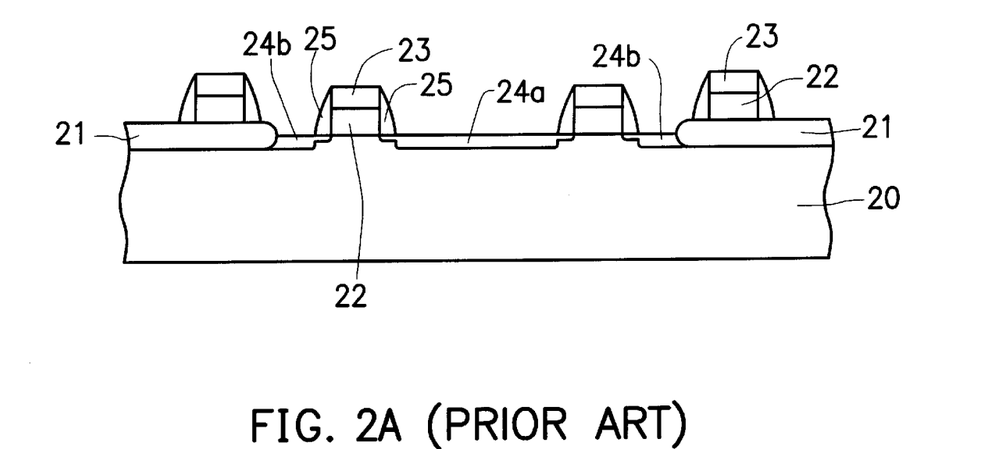
FIGS. 2A–2D are schematic, sectional diagrams used to depict the steps involved in a conventional method for fabricating a stacked-type capacitor.

FIG. 2A shows a stacked-type capacitor constructed on a semiconductor substrate 20, which is already formed with a plurality of field oxide layers 21 at predefined locations to delineate the active regions on the substrate 20. Then, a tungsten silicide layer 22 and a first polysilicon layer 23 are successively formed to constitute a gate structure. A spacer structure 25 is then formed on the sidewall of the gate structure. Further, a pair of source/drain regions 24a, 24b are formed in the substrate 20. The gate structure (22, 23) and the source/drain regions 24a, 24b in combination constitute one MOS transistor for one memory cell of the DRAM device.

Figure 2B:
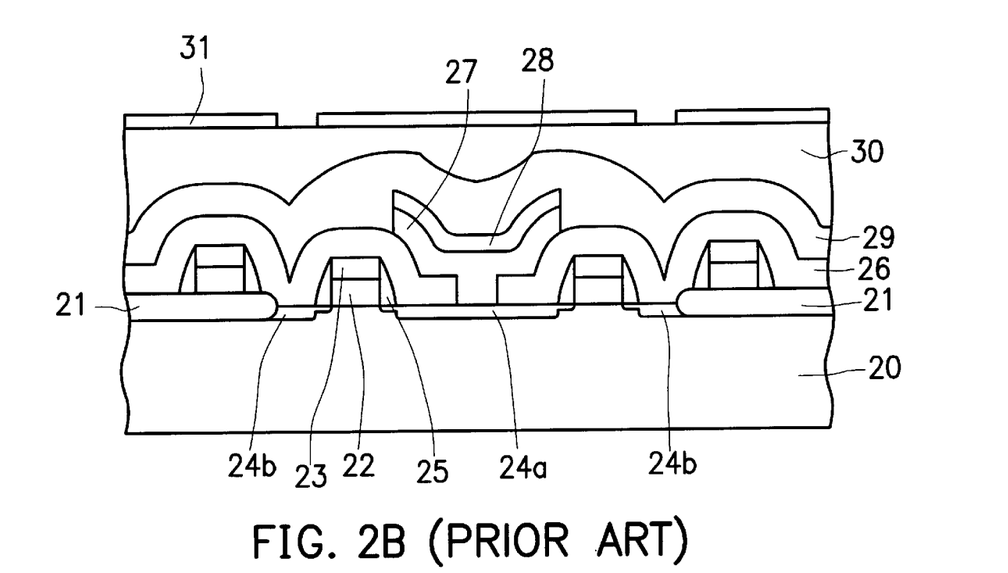

Referring next to FIG. 2B, in the subsequent step, a first insulating layer 26 is formed to cover the gate structure, formed by tungsten silicide layer 22 and first polysilicon layer 23, and the source/drain regions 24a, 24b. The first insulating layer 26 is preferably formed from TEOS (tetra-ethyl-ortho-silicate) through an LPCVD (low-pressure chemical-vapor deposition) process to a thickness of about 1,500 Å (angstrom). Next, a microlithographic and etching process is performed on the first insulating layer 26 so as to define and form a contact window in the first insulating layer 26. The contact window exposes the source/drain region 24a. Subsequently, a second polysilicon layer 27 is formed over the contact window to a predefined extent. After this, a layer of tungsten silicide 28 is formed over the second polysilicon layer 27. The second polysilicon layer 27 is further doped with an impurity element so as to increase the conductivity of the second polysilicon layer 27. A second insulating layer 29 is then formed over the entire top surface of the wafer through, for example, an APCVD (atmospheric-pressure chemical-vapor deposition) process to a thickness of about 1,500 Å. The second insulating layer 29 covers all the exposed surfaces of the first insulating layer 26, the second polysilicon layer 27, and the tungsten silicide layer 28. After this, a layer of borophosphosilicate glass (BPSG) 30 is formed through a reflow process at a temperature of about 850° C. and an etch-back process to a thickness of about 4,500 Å. Subsequently, a hard mask layer 31 is formed by, for example, first depositing a layer of silicon nitride (SiN) over the BPSG layer 30 to a thickness of about 500 Å, and then performing a microlithographic and etching process on the SiN layer to remove selected portions of the SiN layer.

Figure 2C:
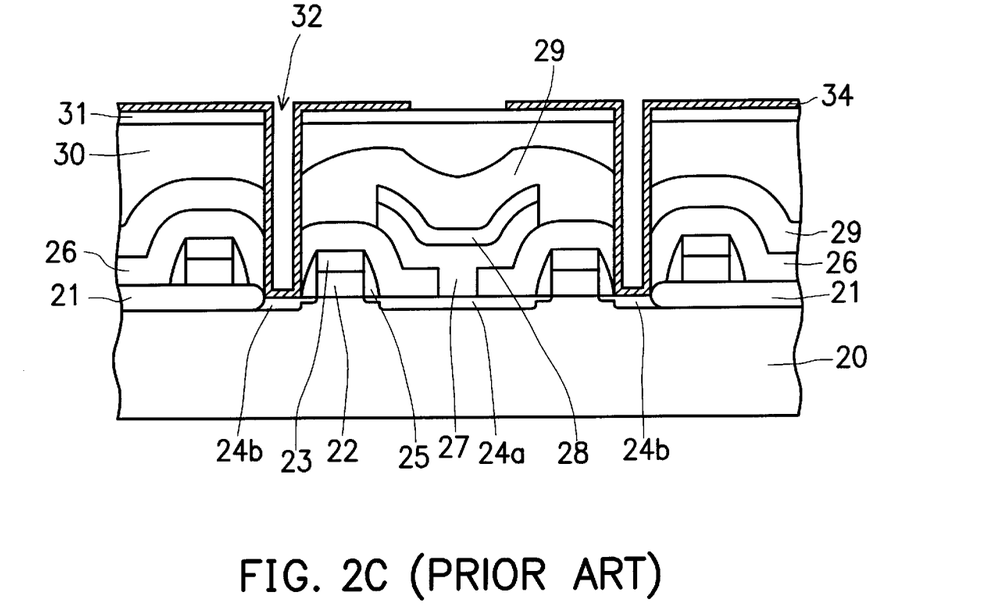

Referring next to FIG. 2C, in the subsequent step, an etching process is performed on the wafer, with the hard mask layer 31 serving as an etching protection layer. This etching process opens a contact window 32 to expose the source/drain region 24b. Next, a doped polysilicon layer 34 is formed to a thickness of about 1,000 Å over the top surface of the hard mask layer 31, the sidewall of the contact window 32, and the exposed surface of the source/drain region 24b.

Figure 2D:
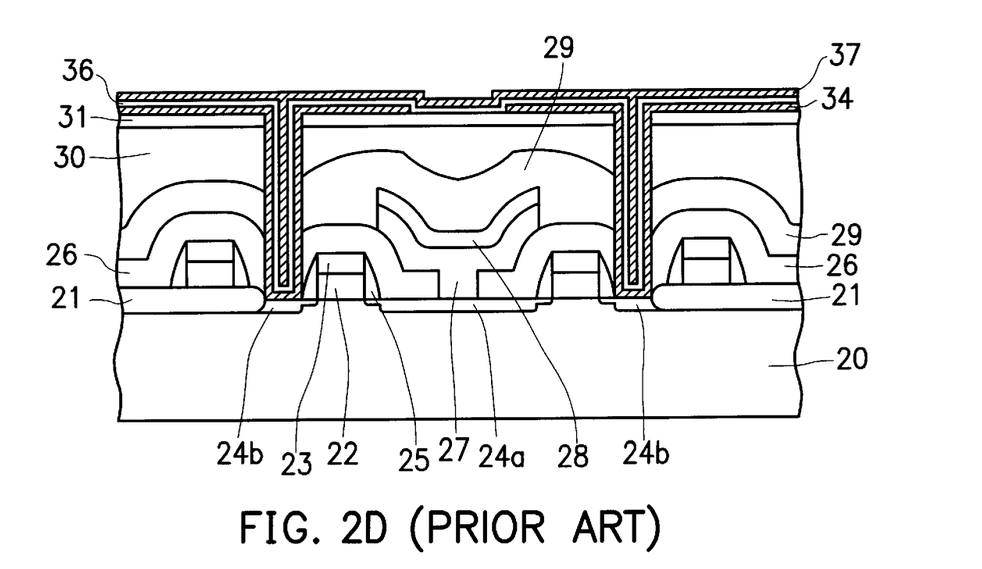

Referring further to FIG. 2D, in the subsequent step, a dielectric layer 36 is deposited over the doped polysilicon layer 34. The dielectric layer 36 can be either a three-layer ONO (silicon dioxide, silicon nitride, and silicon dioxide) structure, a two-layer NO (silicon dioxide and silicon nitride) structure, or a layer of $Ta_2O_5$. After this, a fourth doped polysilicon layer 37 is formed over the dielectric layer 36, which serves as one electrode for one memory cell of the DRAM device.

The foregoing stacked-type capacitor is presently widely utilized in many DRAM products as the data storage element. It is characterized by the formation of a morphology particular to the surface of the electrode structure that allows a relatively large surface area, which in turn allows the resultant capacitor to have a large capacitance.

Despite all of the above-mentioned types of capacitors, the semiconductor industry nevertheless exists a need for newer electrode structures that can help increase the capacitance of the data storage capacitor in DRAM devices, so that the DRAM devices can be further downsized for higher integration while nonetheless retaining reliable data storage capability.

SUMMARY OF THE INVENTION

It is therefore an objective of the present invention to provide a method of fabricating a coronary-type capacitor in integrated circuit, which can help increase the capacitance of the capacitor by forming the electrode of the capacitor with an increased surface area.

In accordance with the foregoing and other objectives of the present invention, a method of fabricating a coronary-type capacitor is provided.

In the method of the invention, the first step is to prepare a semiconductor substrate, which is formed with at least one MOS transistor having a gate and a pair of source/drain regions. The next step is to form an insulating layer over the MOS transistor, with a contact window exposing a first one of the source/drain regions. The subsequent step is to successively form a first polysilicon layer, a first hemispherical grain (HSG) polysilicon layer, a second polysilicon layer, a second HSG polysilcon layer, a third polysilicon layer, a third HSG polysilcon layer, a fourth polysilicon layer, and a fourth HSG polysilcon layer over the insulating layer, in which the first polysilicon layer is electrically connected to the first one of the source/drain regions. A heat-treatment process is then performed on the wafer at a temperature of about 600–700° C. to allow the impurity ions in the polysilicon layers to be activated and evenly diffused over the inside of the polysilicon layers. The next step is to form a void portion in the stacked structure of the second polysilicon layer, the second HSG polysilcon layer, the third polysilicon layer, the third HSG polysilcon layer, the fourth polysilicon layer, and the fourth HSG polysilcon layer by removing a selected portion thereof that is substantially located above the first one of the source/drain regions until the first HSG polysilcon layer is exposed. Then, selected portions are removed from the polysilicon layers and all the HSG polysilcon layers other than those defined as the bottom electrode structure of the capacitor around the void portion. Finally, a selective etching process is performed with an etchant that can react with polysilicon at a faster etching rate than with HSG polysilcon so as to cause the sidewalls of the polysilicon layers to be more recessed relative to the sidewalls of the HSG polysilcon layers, the remaining portions of the polysilicon layers and the HSG polysilcon layers in combination constituting a coronary-shaped electrode structure to serve as the bottom electrode of the capacitor.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 3A–3F are schematic, sectional diagrams used to depict the steps involved in the method of the invention for fabricating a coronary-type capacitor for a DRAM device.

Figure 3A:
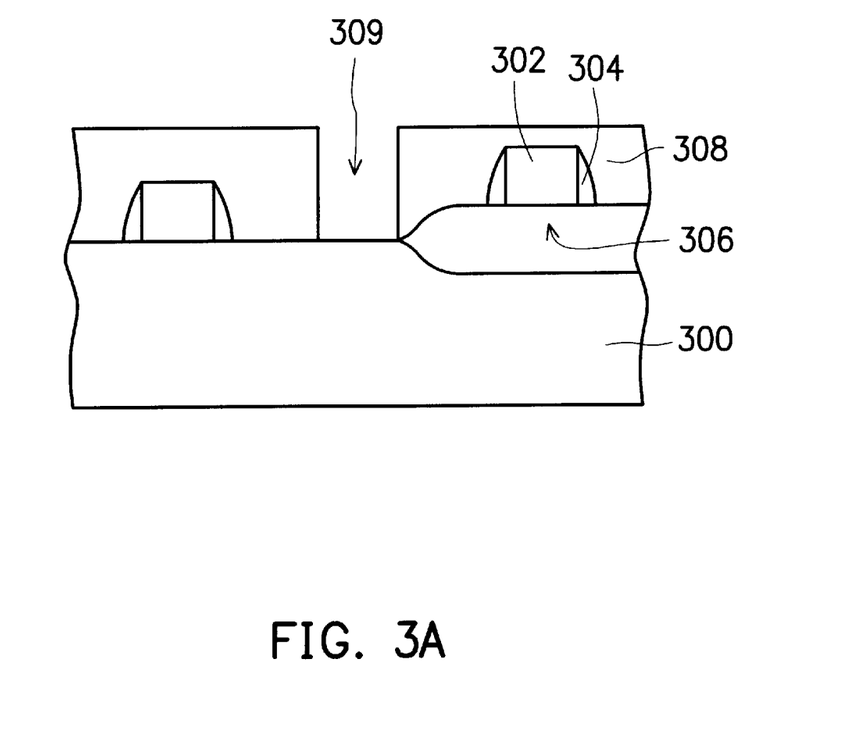
FIGS. 3A–3F are schematic, sectional diagrams used to depict the steps involved in the method of the invention for fabricating a coronary-type capacitor.

FIG. 3A illustrates the first step, in which a semiconductor substrate 300 is prepared and then formed with at least one gate 302, a sidewall spacer 304 on the sidewall of the gate 302, and a plurality of source/drain regions 306. The gate 302 and the neighboring pair of source/drain regions 306 in combination constitute one MOS transistor for one memory cell of the DRAM device. The forming of the MOS transistor structure is a conventional process and not within the spirit and scope of the invention, so description thereof will not be further detailed. After the MOS transistor structure is completed, an insulating layer 308 is then formed over the wafer, covering all the exposed surfaces of the gate 302 and the source/drain regions 306. Further, a contact window 309 is formed in the insulating layer 308 at a predefined location to expose a selected one of the source/drain regions 306.

Figure 3B:
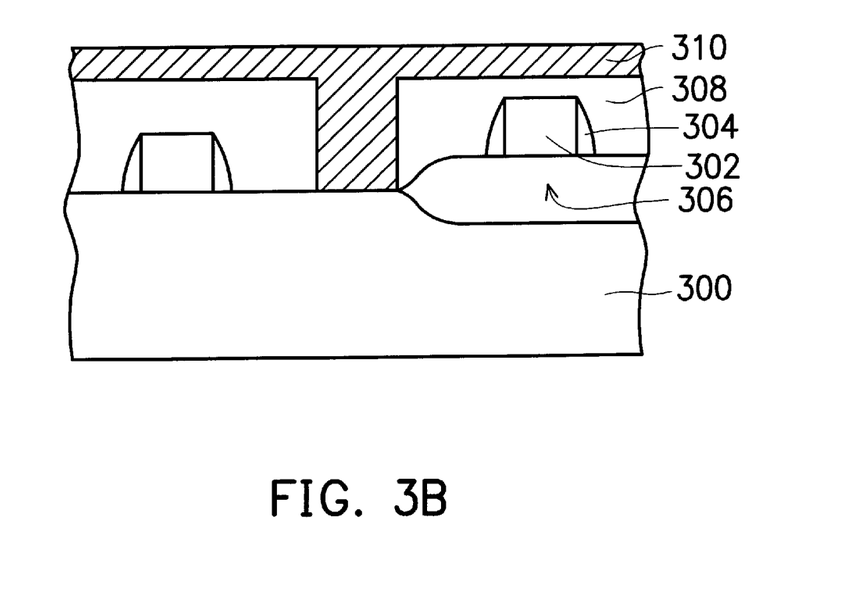

Referring next to FIG. 3B, in the subsequent step, a first polysilicon layer 310 is deposited to a thickness of about 1,000 Å over the insulating layer 308. Through this process, the first polysilicon layer 310 also fills the entire contact window 309. Subsequently, an impurity element, such as phosphorus, is doped into the first polysilicon layer 310 so as to increase the conductivity thereof.

Figure 3C:
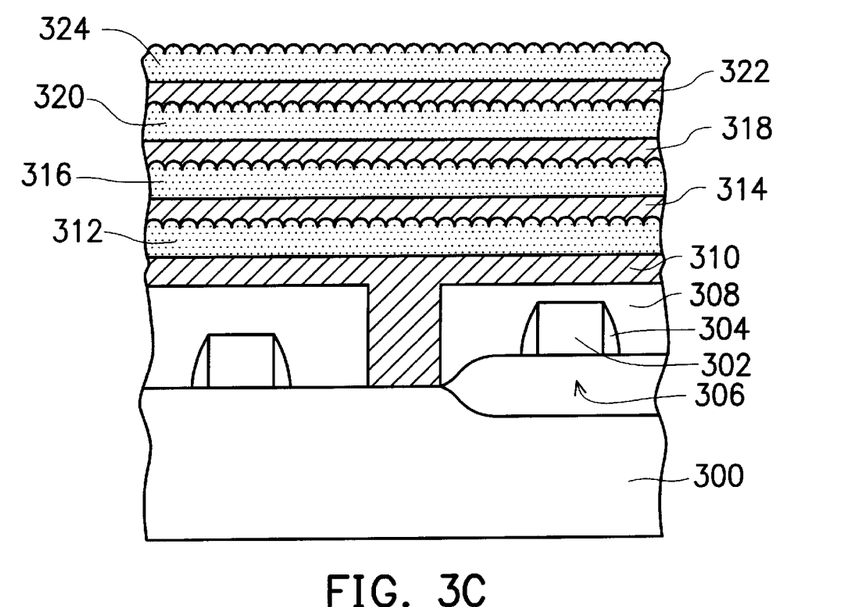
Figure 3D:
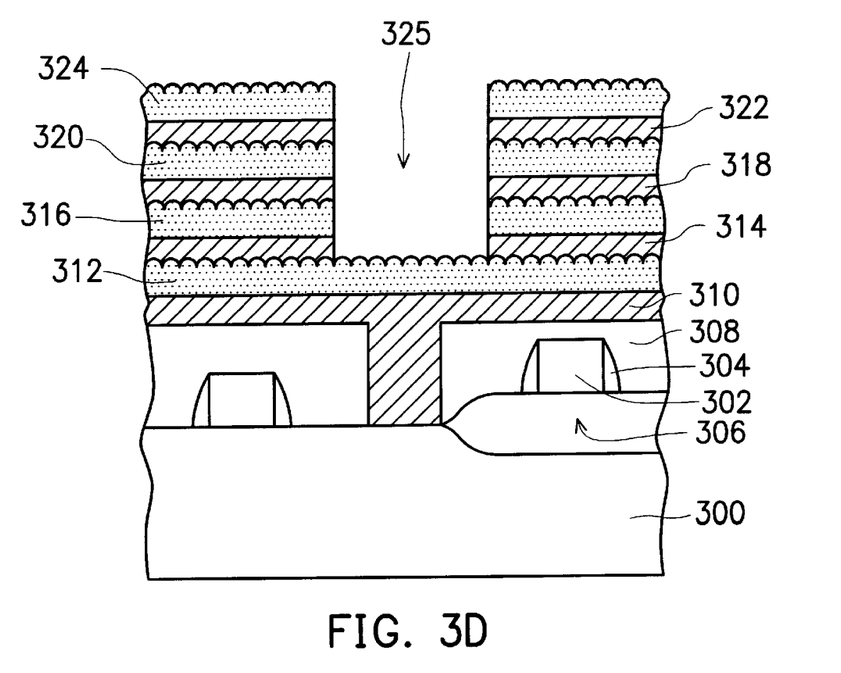

Referring further to FIG. 3C, in the subsequent step, a plurality of polysilicon layers and a plurality of hemispherical grain (HSG) polysilicon layers are successively formed in an alternating manner over the first polysilicon layer 310, including, for example, a first HSG polysilcon layer 312, a second polysilicon layer 314, a second HSG polysilcon layer 316, a third polysilicon layer 318, a third HSG polysilcon layer 320, a fourth polysilicon layer 322, and a fourth HSG polysilcon layer 324. The four HSG polysilcon layers 312, 316, 320, 324 are formed in this case by a method, such as a deposition process. The deposition process is performed preferably at a temperature of about 560–580° C. and under a pressure of about 0.14–0.2 Torr, such that each of the HSG polysilicon layers is formed to a thickness of about 1,000 Å (angstrom) with a wave-like exposed surface. Moreover, the conductivity of the polysilicon layers 314, 318, 322 is increased by doping each of the polysilicon layers 314, 318, 322 with an impurity element such as phosphorus. FIG. 3D shows the subsequent step, in which the entire wafer is subjected to a heat-treatment process at a temperature of about 600–700° C. so as to allow the impurity ions in the first, second, third, and fourth polysilicon layers 310, 314, 318, 322 to be activated and thus more evenly diffused over the inside of these polysilicon layers 310, 314, 318, 322. Subsequently, a first photolithographic and etching process is performed on the wafer at a selected location directly above the source/drain region that is electrically connected to the first polysilicon layer 310. This etching process is performed until the top surface of the first HSG polysilcon layer 312 is exposed, in which process a void portion 325 is formed by removing parts of the fourth HSG polysilcon layer 324, the fourth polysilicon layer 322, the third HSG polysilcon layer 320, the third polysilicon layer 318, the second HSG polysilcon layer 316, and the second polysilicon layer 314.

Figure 3E:
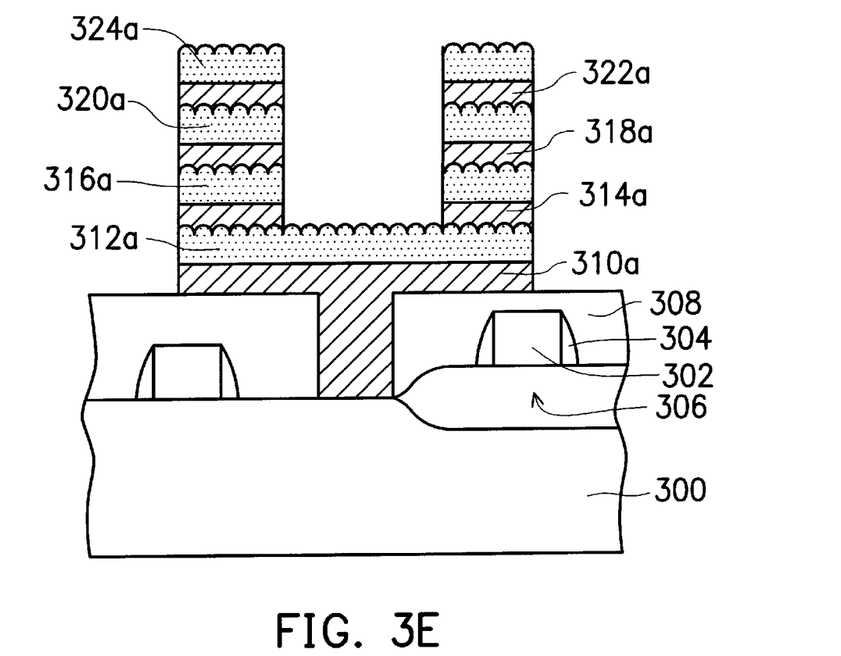

Referring further to FIG. 3E, in the subsequent step, a second photolithographic and etching process is performed on the wafer so as to remove selected portions of the four polysilicon layers 310, 314, 318, 322 and the four HSG polysilcon layers 312, 316, 320, 324 other than those portions surrounding the void portion 325 until the top surface of the insulating layer 308 is exposed. The remaining portions of the four polysilicon layers and the four HSG polysilcon layers are herein designated respectively by the reference numerals 310a, 314a, 318a, 322a and 312a, 316a, 320a, 324a for distinguishing purposes.

Figure 3F:
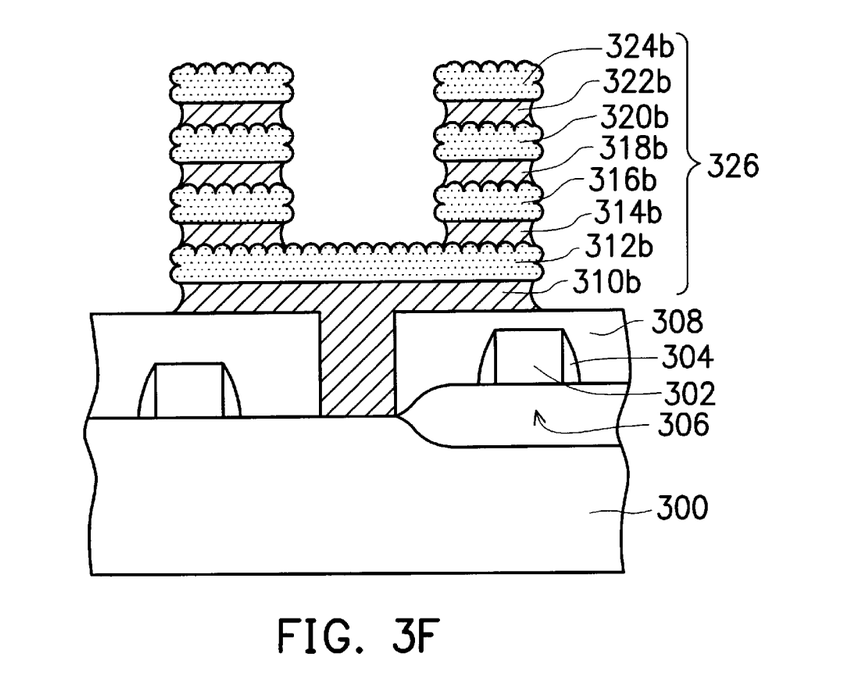

FIG. 3F shows the subsequent step, in which a selective etching process is performed on the wafer. The etchant used in this process is a solution of mixed acids including hydrofluoric acid (HF), nitric acid, and deionized water. This special etchant, in particular, can react with polysilicon at a faster etching rate than with HSG polysilcon. As a result, the sidewalls of the four polysilicon layers 310a, 314a, 318a, 322a(FIG. 3E) are further partly etched away to a controlled extent, causing the sidewalls of the remaining polysilicon layers to be more recessed relative to the sidewalls of the remaining HSG polysilcon layers (the remaining portions are herein designated instead by the reference numerals 310b, 314b, 318b, 322b and 312b, 316b, 320b, 324b for distinguishing purpose), as roughly illustrated in FIG. 3F. The four remaining polysilicon layers 310b, 314b, 318b, 322b and the four remaining HSG polysilcon layers 312b, 316b, 320b, 324b in combination constitute an electrode structure, as collectively designated by the reference numeral 326. This electrode structure 326 serves as the bottom electrode of the data storage capacitor of the associated MOS transistor. After this, conventional processes are performed to complete the fabrication of the capacitor and the DRAM device.

It is to be noted that the number of the polysilicon layers and the number of the HSG polysilcon layers are not limited to four as in the preferred embodiment disclosed above, and can be any number in accordance with actual requirements and allowable layout space.

The resultant capacitor, due to the particular shape of the electrode structure 326, is referred to as a coronary-type capacitor in this specification. The particular surface shapes of the various parts of the electrode structure 326, i.e., the wave-like surface of the HSG polysilcon layers and the recessed sidewalls of the polysilicon layers, allow the electrode structure 326 to have a relatively large surface area, thus allowing the resultant capacitor to have a capacitance considerably than that of the prior art.

In conclusion, the invention provides a method for fabricating a coronary-shaped electrode structure for a capacitor in integrated circuit. The coronary-shaped electrode structure is characterized by the formation of a plurality of crystalline silicon layers with wave-like surfaces and a plurality of polysilicon layers with recessed sidewalls to increase the surface area of the electrode, thus allowing the resultant capacitor to have a relatively large capacitance.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a coronary-type capacitor on a semiconductor substrate which is formed with at least one MOS transistor having a gate and a pair of source/drain regions, the method comprising the steps of:

forming a first polysilicon layer, which is electrically connected to one of the source/drain regions;

forming a first HSG polysilcon layer over the first polysilicon layer;

forming a stacked structure of at least one second HSG polysilcon layer and at least one second polysilicon layer in an alternating manner over the first HSG polysilcon layer;

forming a void portion in the stacked structure by removing a selected portion thereof that is substantially located above the source/drain region electrically connected to the first polysilicon layer until the first HSG polysilcon layer is exposed;

removing selected portions of all the polysilicon layers and all the HSG polysilcon layers other than those portions that are defined as a bottom electrode structure of the capacitor; and performing a selective etching process using an etchant that can react with the polysilicon at a faster etching rate than with the HSG polysilcon so as to cause sidewalls of the polysilicon layers to be more recessed than the sidewalls of the HSG polysilcon layers, wherein the remaining portions of the polysilicon layers and the HSG polysilcon layers in combination constitute a coronary-shaped electrode structure that serves as the bottom electrode of the capacitor.

2. The method of claim 1, wherein the polysilicon layers and the HSG polysilicon layers are each deposited to a thickness of 1,000 Å.

3. The method of claim 1, wherein the polysilicon layers are each doped with an impurity element.

4. The method of claim 3, wherein the impurity element is phosphorus.

5. The method of claim 3, further comprising, prior to the step of forming the void portion, the step of performing a heat-treatment process to activate the impurity ions in the doped polysilicon layers.

6. The method of claim 5, wherein the heat-treatment process is performed at a temperature of 600–700° C.

7. The method of claim 1, wherein the selective etching process is performed with a solution of mixed acids serving as the etchant.

8. The method of claim 7, wherein the solution is a mixture of hydrofluoric acid, nitric acid, and deionized water.

9. A method for fabricating a coronary-type capacitor, the method comprising the steps of:

preparing a semiconductor substrate, which is formed with at least one MOS transistor having a gate and a pair of source/drain regions;

forming an insulating layer over the MOS transistor with a contact window in the insulating layer to expose a selected one of the source/drain regions, successively forming a first polysilicon layer, a first HSG polysilcon layer, a second polysilicon layer, a second HSG polysilcon layer, a third polysilicon layer, a third HSG polysilcon layer, a fourth polysilicon layer, and a fourth HSG polysilcon layer over the insulating layer, in which the first polysilicon layer is electrically connected to the selected one of the source/drain regions;

forming a void portion in a stacked structure, which includes the second polysilicon layer, the second HSG polysilcon layer, the third polysilcon layer, the third HSG polysilcon layer, the fourth polysilicon layer, and the fourth HSG polysilcon layers by removing a selected portion of the stacked structure that is substantially located above the selected one of the source/drain regions until the first HSG polysilcon layer is exposed;

removing selected portions of all the polysilicon layers and all the HSG polysilcon layers other than those portions that are defined as a bottom electrode structure of the capacitor around the void portion; and performing a selective etching process using an etchant that can react with the polysilicon at a faster etching rate than with the HSG polysilicon so as to cause sidewalls of the polysilicon layers to be more recessed than the sidewalls of the HSG polysilicon layers, wherein the remaining portions of the polysilicon layers and the HSG polysilcon layers in combination constitute a coronary-shaped electrode structure that serves as the bottom electrode of the capacitor.

10. The method of claim 9, wherein the first, second, third, and fourth polysilicon layers and the first, second, third, and fourth HSG polysilcon layers are each deposited to a thickness of 1,000 Å.

11. The method of claim 11, wherein the first, second, third, and fourth polysilicon layers are each doped with an impurity element.

12. The method of claim 9, wherein the impurity element is phosphorus.

13. The method of claim 11, which further comprises, prior to the step of forming the void portion, the step of performing a heat-treatment process to activate the impurity ions in the doped polysilicon layers.

14. The method of claim 13, wherein the heat-treatment process is performed at a temperature of 600–700° C.

15. The method of claim 9, wherein the selective etching process is performed with a solution of mixed acids serving as the etchant.

16. The method of claim 15, wherein the solution is a mixture of hydrofluoric acid, nitric acid, and deionized water.

17. A method for fabricating a coronary-type capacitor in a semiconductor wafer, the method comprising the steps of:

preparing a semiconductor substrate, which is formed with at least one MOS transistor having a gate and a pair of source/drain regions;

forming an insulating layer over the MOS transistor, with a contact window exposing a first one of the source/drain regions, successively forming a first doped polysilicon layer, a first HSG polysilcon layer, a second doped polysilicon layer, a second HSG polysilcon layer, a third doped polysilicon layer, a third HSG polysilcon layer, a fourth doped polysilicon layer, and a fourth HSG polysilcon layer over the insulating layer, in which the first doped polysilicon layer is electrically connected to the first one of the source/drain regions;

performing a heat-treatment process on the wafer so as to activate the impurity ions in all of the doped polysilicon layers;

forming a void portion in a stacked structure, which includes the second doped polysilicon layer, the second HSG polysilcon layer, the third doped polysilicon layer, the third HSG polysilcon layer, the fourth doped polysilicon layer, and the fourth HSG polysilcon layer, by removing a selected portion of the stacked structure that is substantially located above the first one of the source/drain regions until the first HSG polysilcon layer is exposed;

removing selected portions of all the doped polysilicon layers and all the HSG polysilcon layers other than those portions that are defined as a bottom electrode structure of the capacitor around the void portion; and performing a selective etching process using an etchant that can react with polysilicon at a faster etching rate than with HSG polysilcon so as to cause sidewalls of the doped polysilicon layers to be more recessed than the sidewalls of the HSG polysilcon layers, wherein the remaining portions of the doped polysilicon layers and the HSG polysilcon layers in combination constitute a coronary-shaped electrode structure that serves as the bottom electrode of the capacitor.

18. The method of claim 17, wherein the first, second, third, and fourth doped polysilicon layers and the first, second, third, and fourth HSG polysilcon layers are each deposited to a thickness of 1,000 Å.

19. The method of claim 17, wherein the first, second, third, and fourth doped polysilicon layers are each doped with phosphorus ions.

20. The method of claim 17, wherein the heat-treatment process is performed at a temperature of 600–700° C.

21. The method of claim 17, wherein the etchant used in the selective etching process is a mixture of hydrofluoric acid, nitric acid, and deionized water.

* * * * *